United States Patent
Yen et al.

(10) Patent No.: US 12,019,702 B2
(45) Date of Patent: Jun. 25, 2024

(54) THROUGHPUT AND PRECISION-PROGRAMMABLE MULTIPLIER-ACCUMULATOR ARCHITECTURE

(71) Applicant: Applied Materials, Inc., Santa Clara, CA (US)

(72) Inventors: She-Hwa Yen, Mountain View, CA (US); Xiaofeng Zhang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 564 days.

(21) Appl. No.: 17/092,258

(22) Filed: Nov. 7, 2020

(65) Prior Publication Data

US 2022/0113942 A1   Apr. 14, 2022

Related U.S. Application Data

(60) Provisional application No. 63/089,499, filed on Oct. 8, 2020.

(51) Int. Cl.
*G06F 17/16* (2006.01)
*G06F 7/544* (2006.01)
(Continued)

(52) U.S. Cl.
CPC ............ *G06F 17/16* (2013.01); *G06F 7/5443* (2013.01); *G06G 7/16* (2013.01); *H03M 1/74* (2013.01); *H03M 1/1205* (2013.01)

(58) Field of Classification Search
CPC ...... G06F 7/5443; G06F 17/15; G06F 17/153; G06F 17/16; G06G 7/16–163; H03M 1/74; H03M 1/1205
See application file for complete search history.

(56) References Cited

U.S. PATENT DOCUMENTS 5,835,045 A   11/1998 Ogawa et al.
6,611,164 B2   8/2003 Uno
(Continued)

FOREIGN PATENT DOCUMENTS

KR   20200058381 A   5/2020
TW   202029607 A   8/2020

OTHER PUBLICATIONS

R. Genov and G. Cauwenberghs, "Massively parallel inner-product array processor," IJCNN'01. International Joint Conference on Neural Networks. Proceedings (Cat. No.01CH37222), Washington, DC, USA, 2001, pp. 183-188 vol. 1, doi: 10.1109/IJCNN.2001. 939014. (Year: 2001).*

(Continued)

*Primary Examiner* — Andrew Caldwell
*Assistant Examiner* — Carlo Waje
(74) *Attorney, Agent, or Firm* — Kilpatrick Townsend & Stockton LLP

(57) ABSTRACT

A method and circuit for performing multi-layer vector-matrix multiplication operations may include, at a first multiplier-accumulator (MAC) layer, converting a digital input vector using one-bit digital to analog converters (DACs); sequentially performing vector-matrix multiplication operations for the analog DAC signals; and sequentially performing an analog-to-digital (ADC) operation on outputs of the vector-matrix multiplication operations to generate binary partial output vectors. At a second MAC layer, the method and circuit may sequentially receive the binary partial output vectors from the first MAC layer at multi-bit DACs; and sequentially perform vector-matrix multiplication operations to generate a summed binary output for the second MAC layer.

20 Claims, 12 Drawing Sheets

(51) Int. Cl.
*G06G 7/16* (2006.01)
*H03M 1/74* (2006.01)
*H03M 1/12* (2006.01)

(56) References Cited

U.S. PATENT DOCUMENTS

| | | | |
|---|---|---|---|
| 8,228,076 | B2 | 7/2012 | Cormier, Jr. et al. |
| 11,355,167 | B2* | 6/2022 | Seok .................... G11C 7/1078 |
| 11,681,776 | B2 | 6/2023 | Zhang et al. |
| 2004/0243657 | A1 | 12/2004 | Goren et al. |
| 2017/0228345 | A1 | 8/2017 | Gupta et al. |
| 2018/0157622 | A1 | 6/2018 | Dourbal |
| 2019/0080230 | A1 | 3/2019 | Hatcher et al. |
| 2020/0081937 | A1 | 3/2020 | Fick et al. |
| 2020/0242190 | A1* | 7/2020 | McCollum ....... H03K 19/17744 |
| 2020/0401206 | A1 | 12/2020 | Kallam et al. |
| 2022/0108158 | A1* | 4/2022 | Grobis .................... G11C 11/15 |
| 2022/0113941 | A1 | 4/2022 | Zhang et al. |
| 2022/0113942 | A1 | 4/2022 | Yen et al. |

OTHER PUBLICATIONS

Lee et al., "Analysis and Design of a Passive Switched-Capacitor Matrix Multiplier for Approximate Computing", Institute of Electrical and Electronics Engineers Journal of Solid-State Circuits, vol. 52, No. 1, Available online at: https://arxiv.org/pdf/1612.00933v1.pdf, Sep. 29, 2016, pp. 1-34.
Application No. PCT/US2021/052508, International Search Report and Written Opinion, Mailed On Jan. 17, 2022, 9 pages.

* cited by examiner

THROUGHPUT AND PRECISION-PROGRAMMABLE MULTIPLIER-ACCUMULATOR ARCHITECTURE

CROSS-REFERENCES TO RELATED APPLICATIONS

This application claims the benefit of U.S. Provisional Application No. 63/089,499, filed Oct. 8, 2020, titled "PROGRAMMABLE ANALOG VECTOR-MATRIX MULTIPLIER-ACCUMULATOR," the entire contents of which, including an appendix" is incorporated herein by reference in its entirety for all purposes.

TECHNICAL FIELD

This disclosure generally relates to multiplier-accumulator (MAC) operations and implementations. Specifically, this disclosure relates to a multi-layer MAC pipeline with configurable precision and throughput using partial binary results.

BACKGROUND

A vector-matrix multiplication operation can be defined as the sum of a product of a vector and a matrix. Specifically, Equation 1 can be used to define a vector-matrix multiplication operation in which the product is summed.

$$Y = \sum_i W_{ij} X_i \qquad \text{Eq. 1}$$

In Equation 1, $X_i$ is an input vector composed of values (which can be represented in an electronic environment using binary bits) and $W_{ij}$ represents matrix weighting values. Y is the output vector obtained by summing the product vector. This function has applications in various signal processing, image processing, and artificial intelligence applications, such as in the use of neural-networks.

Performing this equation, when performed digitally, can consume a significant amount of processing resources and/or energy. Conventional analog componentry or digital and analog hybrid componentry can require a relatively large number of clock cycles, and/or a relatively large area of space to implement.

SUMMARY

In some embodiments, a method for performing multi-layer vector-matrix multiplication operations may include, at a first multiplier-accumulator (MAC) layer, converting a digital input vector comprising a plurality of binary-encoded values into a first plurality of analog signals using a plurality of one-bit digital to analog converters (DACs), sequentially performing first vector-matrix multiplication operations for the first plurality of analog signals to generate analog outputs, and sequentially performing an analog-to-digital (ADC) operation on the analog outputs of the first vector-matrix multiplication operations to generate binary partial output vectors for each bit-order. The method may also include, at a second MAC layer, sequentially receiving the binary partial output vectors from the first MAC layer at a plurality of multi-bit DACs to generate a second plurality of analog signals, and generating a summed binary output for the second MAC layer.

In any embodiment, any or all of the following features may be included in any combination and without limitation. The method may also include combining the binary partial output vectors to generate a result for the first MAC layer. The summed binary output for the second MAC layer may be available one clock cycle after the result for the first MAC layer is available. The method may additionally include, at a third MAC layer, sequentially receiving second binary partial output vectors from the second MAC layer, and generating a summed binary output for the third MAC layer that is available one clock cycle after the summed binary output for the second MAC layer. The binary partial output vectors may be routed from the first MAC layer through one or more multiplexers after performing the ADC operation. The one or more multiplexers may also route the binary partial output vectors to a binary shift and binary add operation in the first MAC layer. A number of bits received by the plurality of multi-bit DACs in the second MAC layer may correspond to a precision of the ADC operation in the first MAC layer. A number of clock cycles to sequentially perform the vector-matrix multiplication operations may be equal to a number of bit-orders of the binary-encoded values of the input vector. Sequentially performing the ADC operation may include storing a first voltage representing a first analog output in the analog outputs on a first capacitor during a current clock cycle, and reading a second voltage representing a second analog output in the analog outputs on a second capacitor during the current clock cycle, where the second voltage may have been stored on the second capacitor during a previous clock cycle.

In some embodiments, a multi-layer vector-matrix multiplier circuit may include a first multiplier-accumulator (MAC) layer. The first MAC layer may include a plurality of one-bit digital to analog converters (DACs), where each one-bit DAC may output a binary-encoded analog signal for a corresponding digital input; a first analog vector matrix multiplier circuit that performs binary-encoded vector multiplication operations on a single bit-order at a time, where the first analog vector matrix multiplier circuit may receive the binary-encoded analog signal from each one-bit DAC of the plurality of one-bit DACs and generates analog outputs corresponding to the single bit-orders; and an analog-to-digital converter (ADC) that generates binary partial output vectors from the analog outputs. The circuit may also include a second MAC layer that may include a plurality of multi-bit DACs that sequentially receive the binary partial output vectors from the first MAC layer and generate a second plurality of analog signals; and a second analog vector matrix multiplier circuit that performs vector-matrix multiplication operations a single bit-order at a time for the second plurality of analog signals.

In any embodiment, any or all of the following features may be included in any combination and without limitation. A comparator may compare a voltage representing an analog output in the analog outputs to a voltage reference to generate the binary partial output vectors. A finite state machine may generate digital feedback based on a result of comparing the voltage to the voltage reference. A plurality of DACs may convert the digital feedback into analog feedback and inject the analog feedback into the voltage and the voltage reference to repeatedly generate bits through the comparator for a binary partial output vector in the binary partial output vectors. The first analog vector matrix multiplier circuit may output a plurality of currents indicative of vector multiplication outputs. The first analog vector matrix multiplier circuit may include a plurality of weighting components that may apply a pre-defined weighting to output from the first analog vector matrix multiplier circuit. The ADC may include a capacitor network comprising a first pipeline and a second pipeline of capacitors and switches. The first MAC layer may include a binary-weighted summation circuit that may include a binary shift and a binary addition operation. The binary-weighted summation circuit may include a circuit that detects when a maximum output value has been reached and terminates the binary-encoded vector multiplication operations. A number of clock cycles to sequentially perform the vector-matrix multiplication operations for each-bit-order may be equal to a number of bit-orders of the binary-encoded values of the input vector

BRIEF DESCRIPTION OF THE DRAWINGS

A further understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Figure 1:
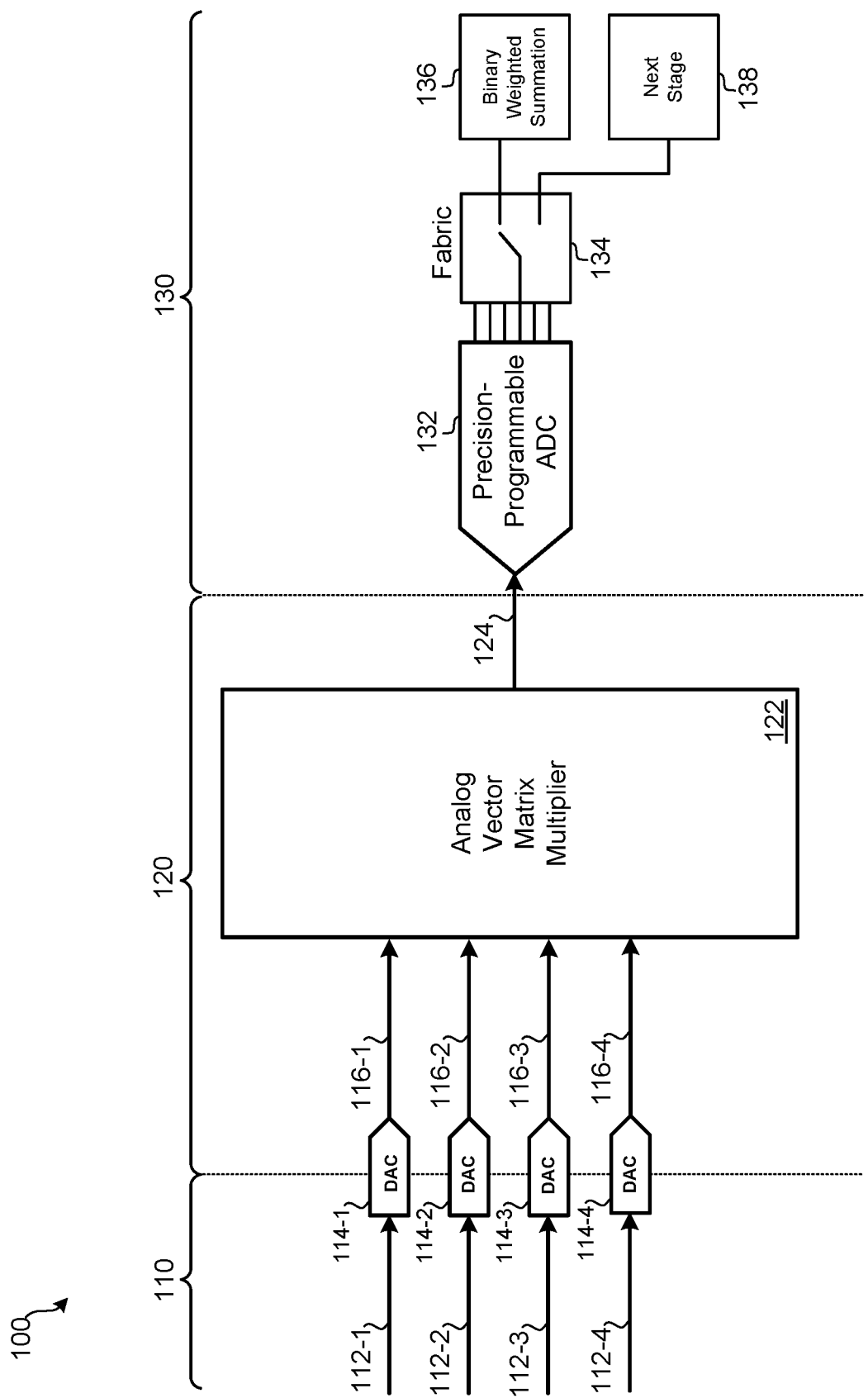
FIG. 1 illustrates an embodiment of a vector-matrix multiplier circuit in which vector multiplication is performed using analog components to bit-ordered binary values.

Traditional MAC designs require processing to be complete in one stage of a MAC pipeline before that value can be passed on to a subsequent stage. For analog multipliers, this includes converting a digital input into an analog signal, multiplying the analog signal with a weighting matrix, and converting the analog output into a digital representation. This digital representation may then be passed on to a subsequent stage, which also converts that digital representation back into an analog signal for multiplication. The output of the multiplier is summed in the analog domain before conversion back into the binary domain. This creates a technical problem where the precision and throughput of a MAC unit cannot be changed after implementation. This also limits the scalability and types of applications for which a MAC array can be used.

The embodiments described herein use layers of bit-order MACs that generate binary partial output vectors that can then be passed to a subsequent MAC layer for processing in a pipeline. Binary partial output vectors are generated in one layer and fed sequentially into a multi-bit DAC and a subsequent layer as they are generated. The subsequent layer may begin processing the binary partial output vectors on the following clock cycle. This allows multiple layers to be pipelined together such that results are generated on every clock cycle at subsequent layers. After initial N cycle delay in the first layer for an N-bit input, results may be available at subsequent layers in cycle N+1, N+2, and so forth. The number of bits at each level may be dynamically adjusted to allow a runtime trade-off between throughput and precision.

Embodiments detailed herein allow for MAC operations to be performed during a shorter amount of time (e.g., fewer clock cycles) compared to conventional analog embodiments and do not require digital input signals to be decoded. Rather, input vectors in the form of binary encoded (or "bit-ordered") values can be received. Such values are typically arranged from LSB to MSB, or MSB to LSB (e.g., "1110", representing a value of 14). These values can be multiplied in the analog domain then summed in the analog or digital domain. Arrangements detailed herein are performed directly on analog conversions of binary encoded values and do not require the input vectors to be converted to a series of pulses (e.g., fourteen pulses to represent a value of 14). Thus, computation can be performed significantly quicker than conventional analog arrangements. More specifically, the number of operation cycles to perform vector-matrix multiplication can be reduced by $$\frac{2^{Nbit}}{Nbit + 2}$$

times. In this equation, the additional 2 cycles indicated in the denominator can vary by implementation. For example, embodiments detailed herein can perform vector-matrix multiplication for 8-bit input vectors that may be sped up 25.6 times as compared to conventional analog MAC designs.

Further, the arrangements detailed herein may have significant space savings over conventional analog MAC designs. By using one bit digital-to-analog converters (DACs), less area may be needed than if multi-bit DACs that convert a binary value received in parallel are used. Specifically, multiple one bit DACs may be used to convert binary-encoded input vectors to binary-encoded analog voltage values in parallel. For instance, for four bit input vectors, four clock cycles may be needed to output the binary-encoded analog voltage value from the one-bit DAC (one cycle for LSB, one cycle for second LSB, one cycle for second MSB, one cycle for MSB). The number of one-bit DACs may be dependent on the number of input vectors ($X_i$ in Equation 1).

Matrix multiplication operations may be performed sequentially for each bit-order of the input vector's values at a time. The parallel output of each one-bit DAC may be input to weighting components of a vector matrix multiplier circuit. The vector matrix multiplier circuit may have various weighting components that correspond to the $W_{ij}$ matrix of Equation 1 with which $X_i$ is being multiplied. The vector matrix multiplier circuit may perform multiplication operations for each bit-order of the input vectors. Therefore, if the input vector contains values four bits in length, the vector matrix multiplier circuit may perform multiplication operations for each of the four bit-orders sequentially in the time domain. The output from the vector matrix multiplier circuit may be sequential signals (e.g., that have a current or some of electrical characteristic indicative of a multiplication result) that are output to a summation circuit.

The summation circuit may function to perform a bit-order weighted summation after the matrix multiplication operations have been performed. The summation circuit may function in either the analog or digital domain. The summation circuit may receive signals from the vector matrix multiplication circuit, store indications of each matrix multiplication operation in such a way that it is weighted for the proper bit-order, and perform a summation to determine the output value Y.

FIG. 1 illustrates an embodiment of a circuit 100 in which vector multiplication is performed using analog components on binary-encoded inputs. Circuit 100 can include: one-bit DACs 114; analog vector matrix multiplier 122; and an output circuit 130. Circuit 100 can be understood as divided into three sections. Section 110 receives binary-encoded digital signals (which represent an input vector) and converts the binary-encoded digital signals to binary-encoded analog signals. Section 120 receives binary-encoded analog signals and outputs binary-encoded products indicative of multiplication between the binary-encoded analog signals and a pre-defined matrix (e.g., a weighting matrix). The output circuit 130 performs a bit-order weighted summation to sum the binary-encoded products and take into account the bit-order weighting of the binary-encoded signals. Therefore, the proper bit-orders of each bit of the binary-encoded input signals is maintained such that the summation can be determined properly. The output circuit 130 may use analog componentry to efficiently sum the product outputs of section 120. The output circuit 130 may also function in the digital domain.

Specifically, in section 110, multiple digital input signals 112 may be received in parallel. Digital input signals 112 represent binary-encoded values and each digital input signal of digital input signals 112 can represent a value of the vector $X_i$ of Equation 1. The binary bits of input signals 112 may be represented by voltage levels (e.g., high for one, low for zero), pulses (e.g., a pulse for one, no pulse for zero) or time (e.g., a pulse of a first duration for one, a pulse of a second duration for zero). As illustrated, four digital input signals (112-1, 112-2, 112-3, and 112-4) may be received in parallel. Each of these input signals may receive a separate value of the input vector. In other embodiments, fewer or greater numbers of digital input signals may be received than specifically illustrated in FIG. 1. Each of digital input signals 112 may be binary-encoded. Therefore, for each clock-cycle of the digital portion of the circuit, a bit for a particular bit-order may be received as digital input signals 112. For example, if four-bit binary values are being input via each digital input signal 112, four clock cycles may be used for each bit of the binary values to be received and converted to the analog domain in parallel. The digital input signals 112 may be binary-encoded such that each value's bit-order is from least significant bit (LSB) to most significant bit (MSB), from MSB to LSB, or in an arbitrary, pre-defined pattern.

Digital input signals 112 may be input to one-bit DACs 114. Again here, as illustrated, four one-bit DACs 114 (114-1, 114-2, 114-3, and 114-4) are present. In other embodiments, fewer or greater numbers of one-bit DACs 114 may be present. A single one-bit DAC may be present for each binary-encoded digital input signal 112. Each of the one-bit DACs 114 may output an analog signal indicative of the digital value received. Therefore, binary-encoded analog signals 116 (116-1, 116-2, 116-3, 116-4) can represent analog translations of the digital input signals 112.

In section 120, analog vector matrix multiplier 122 may receive binary-encoded analog signals 116. Analog vector matrix multiplier 122 may sequentially perform multiplication operations on each bit-order of the input values (e.g., a first clock cycle for the LSBs, a second clock cycle for the second LSBs, a third clock cycle for the second MSB, etc.). Therefore, a separate multiplication operation may be performed for each bit-order of the received binary-encoded analog signals 116. Further details regarding possible embodiments of analog vector matrix multiplier 122 are provided below in relation to FIG. 2.

The binary-encoded multiplication results signal 124 may be output to an output circuit 130. Previous implementations of the output circuit 130 may perform a binary-weighted summation operation on the analog outputs from the multiplier. For example, analog signals may be accumulated on capacitors in a switch capacitor array having capacitance values corresponding to bit-order. Each bit-order operation from the multiplier 122 may store the analog result on a capacitor. At the end of the multiplication cycle, charge may be redistributed between all of the capacitors, and the resulting voltage may then pass through an analog-to-digital converter (ADC) to generate a final result in the digital domain. Therefore, the binary-weighted accumulation operation took place prior to the ADC operation.

In contrast to these previous implementations, the output circuit 130 may perform an ADC operation on the analog partial outputs from each of the multiplication cycles. A programmable ADC 132 may be used to control the number of bits provided by the ADC function. This allows the precision of the ADC 132 to be programmable at runtime. While previous implementations may use static numbers of bits on the output such that the precision is not programmable, these embodiments allow a dynamic trade-off to be made between speed and precision.

First, the system may control the number of cycles performed by the multiplier 122 using the one-bit DACs 114. For example, if 8-bit inputs are provided to the DACs 114, a setting or input may be received that causes the DACs 114 to only consider the 4 most-significant-bits of the input. This allows the inputs to be truncated to an effective bit significance to limit the number of multiplication cycles performed by the multiplier 122. Alternatively, a system providing inputs to the DACs 114 may provide vectors of any length, and an input may be provided to the DACs 114 and/or the multiplier 122 that causes them to perform the specified number of cycles based on the input length of the provided input vectors.

Second, performing the ADC operation on the analog partial results output from the multiplier 122 provides further programmability and options for setting the precision of the system. For example, 8-bit inputs may be provided to the DACs 114, and eight corresponding multiplication cycles may be performed by the multiplier 122. However, the ADC 132 may be programmed to only output 2-bit outputs representing each partial result. This allows the number of bits provided on the output to also be programmable at runtime. No hardware needs to be changed because a setting or input may be provided to the ADC 132 at runtime to control the number of bits provided at the output of the ADC 132 for each partial result.

Switching fabric 134 (e.g., a plurality of multiplexers coupled to each output of the ADC 132) may route the binary partial results from the ADC 132 to a number of different locations. First, the binary partial results may be routed to a binary-weighted summation circuit 136. Instead of using analog capacitors or other analog circuitry, the binary-weighted summation can be performed entirely in the binary domain. For example, the binary-weighted summation circuit 136 may be implemented using a binary shifter and a binary adder in the binary domain. When the first binary partial result is received, that binary partial result may be added to an empty accumulation register. When subsequent binary partial results are received, they may be shifted to the right a number corresponding to their bit order. For example, the second binary partial result could be shifted one bit to the right and then added to the accumulation register. A new binary partial result may be received at each clock cycle after the binary partial result is received, and the final result may be stored in the accumulation register of the binary-weighted summation circuit 136 N clock cycles after the first binary partial result is received for an N-bit input.

The switching fabric 134 may also route the binary partial results to subsequent MAC stages in a multi-MAC pipeline or crossbar array. A subsequent bit-order MAC 138 may receive and provide the partial results at corresponding one-bit DACs 114 in the subsequent stage. This allows a subsequent bit-order MAC 138 to immediately begin executing multiplication cycles. This may also allow subsequent-order MACs to generate results as soon one clock cycle after a result is generated in a previous bit-order MAC in a processing pipeline. For example, if the first bit-order MAC generates a result in N clock cycles, a subsequent bit-order MAC 138 may generate a result based on this previous result at the N+1 clock cycle. The Mth stage in an N-bit pipeline may generate a final result in approximately N+M clocks cycles instead of N×M clock cycles.

Figure 2A:
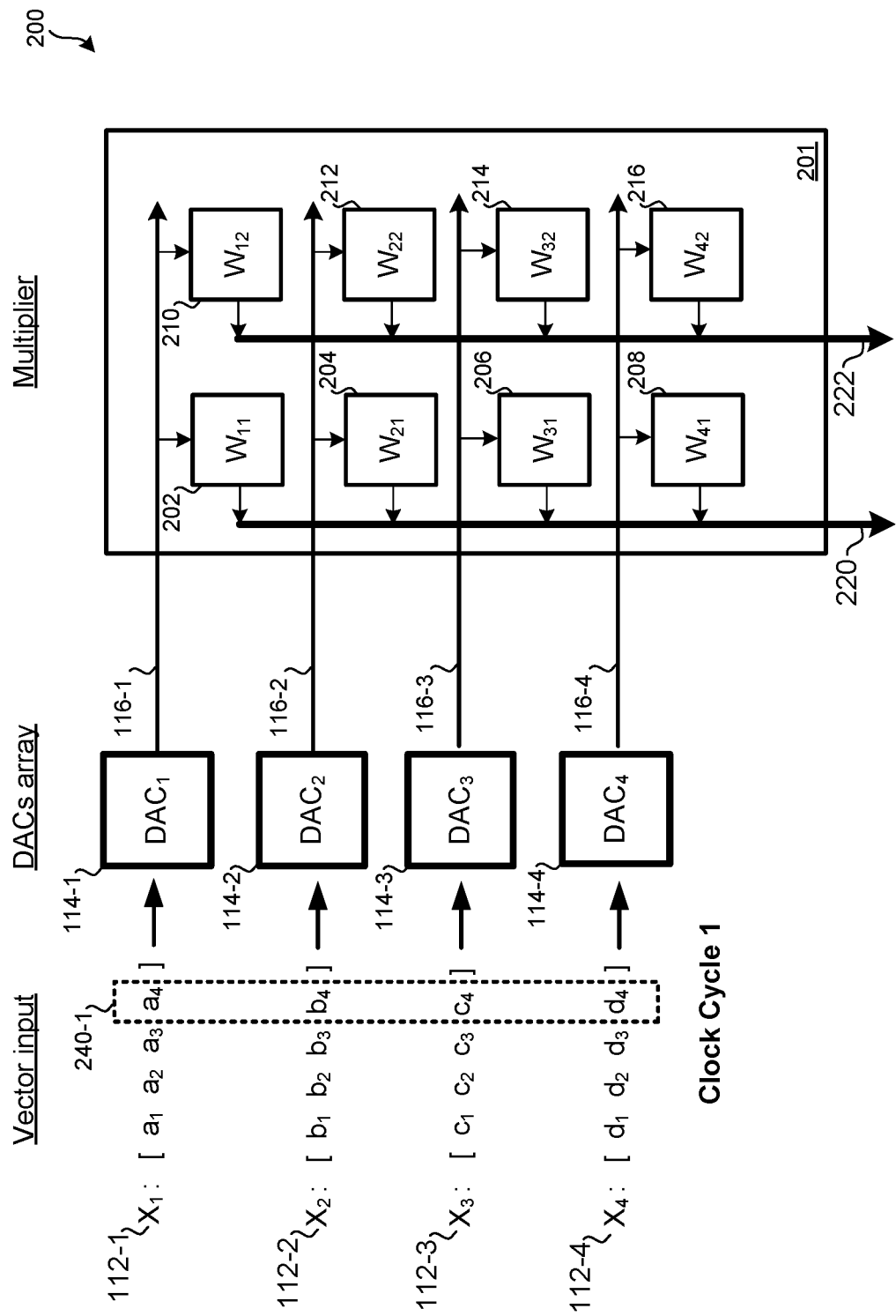
FIG. 2A illustrates an analog vector matrix multiplier that evaluates a single bit-order of an input vector that has been converted to analog during a first clock cycle, according to some embodiments.

FIG. 2A illustrates an analog vector matrix multiplier circuit 200 that evaluates a single bit-order of an input vector that has been converted to analog during a first clock cycle, according to some embodiments. Analog vector matrix multiplier 201 may represent an embodiment of analog vector matrix multiplier 122 of FIG. 1. However, it should be understood that this embodiment is only an example. In FIG. 2, the binary vector input $X_i$ is to be multiplied with $W_{ij}$. Analog vector matrix multiplier 201 may include multiple weighting elements (202, 204, 206, 208, 210, 212, 214, and 216). Each weighting element may receive a binary-encoded analog signal of binary-encoded analog signals 116 from a one-bit DAC. In this example, the weighting element may output a current based on the voltage of its received binary-encoded analog signal and a weighting value of the particular weighting element. For instance, each weighting element may be implemented using various conductances. By varying the conductances of the weighting components, the amount of current output depending on the input voltage can be varied. For instance, if the voltage is 1 V, and the conductance of a weighting block is 8 μS, an output of 8 μA may be obtained. This value may further be weighted based on the bit-order of the value. Therefore, for the least significant bit, the multiplier would be 1, for the second LSB, the multiplier would be 2, and so on. In some embodiments, the weightings used by each weighting element may be predetermined and fixed at manufacture. In other embodiments, the weighting of each weighting element may be configurable after manufacture and reconfigurable during use of embodiment 200.

The output of each weighting element (202, 204, 206, 208, 210, 212, 214, and 216) can be an electrical characteristic, such as current. The currents output from the weighting elements connected to a same current output may be summed together. Therefore, current output 220 may include the sums of the current output by weighting elements 202, 204, 206, and 208; and current output 222 may include the sums of the current output by weighting elements 210, 212, 214, and 216.

A single bit of each value of the input vector is evaluated at a time (and bit-order is not taken into account by analog vector matrix multiplier 201). For example, for an input vector having four four-bit values, the MSB of each value may be evaluated first, followed by the second MSB of each value, followed by the second LSB, and finally followed by the LSB of each value (thus corresponding to four clock cycles of binary-encoded data output by the one-bit DACs). In other embodiments, evaluation may proceed from LSB to MSB or in any other predefined, arbitrary order. As detailed later in this document, the output of analog vector matrix multiplier 201 may be weighted by the summation circuitry to take into account the bit-order of the bits to which the multiplication operation is being performed by the vector matrix multiplier.

The number of columns of weighting elements is arbitrary and can be based on the weighting matrix with which the input vector is being multiplied. Therefore, while two columns are present in embodiment 200, fewer or a greater number of columns may be present in other elements. The number of rows of weighting elements may correspond to the number of values present in the input vector. For example, equation 2 can represent the current output by analog vector matrix multiplier 201:

$$I_{out_i} = \sum_{j=1}^{4} v_j * w_{ji}, i = 1 \ldots n \qquad \text{Eq. 2}$$

Continuing with the example, current outputs (e.g., current outputs 220, 222) may be connected together to create a binary-encoded multiplication result signal 124. Summation componentry 132 properly weights, stores, then sums each bit-order to obtain a correct final summation.

Figure 2B:
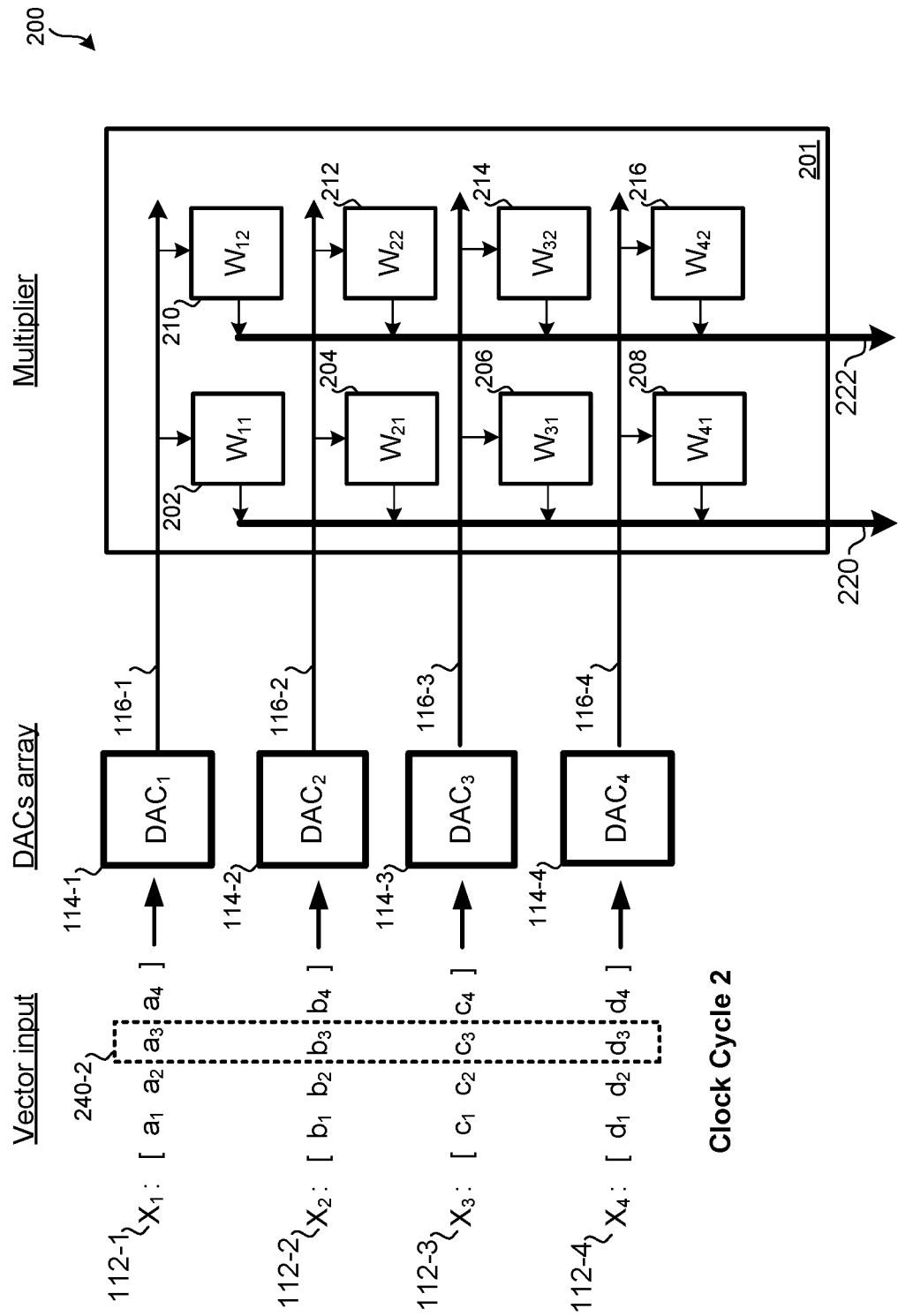
FIG. 2B illustrates the analog vector matrix multiplier during a second clock cycle, according to some embodiments.

FIG. 2B illustrates the analog vector matrix multiplier 201 during a second clock cycle, according to some embodiments. Instead of processing the $a_4, b_4, c_4, d_4$ bits from each digital input signals 112, the DACs 114 and multiplier 201 may process the $a_3, b_3, c_3, d_3$ bits from each of the digital input signals 112. Note that these inputs may be processed without requiring other bits in the input vectors. Thus, to begin processing the digital input signals 112 during a clock cycle, the DAC is 114 only need one bit from each of the digital input signals 112 to be available during that clock cycle. This allows bits to arrive serially at the DACs 114 as they are produced as partial outputs from previous multiplication operations. Described above, an ADC operation may be performed on each partial result, and these bits from the ADC operation may be provided to a subsequent set of DACs 114 in a subsequent bit-order MAC.

Figure 3:
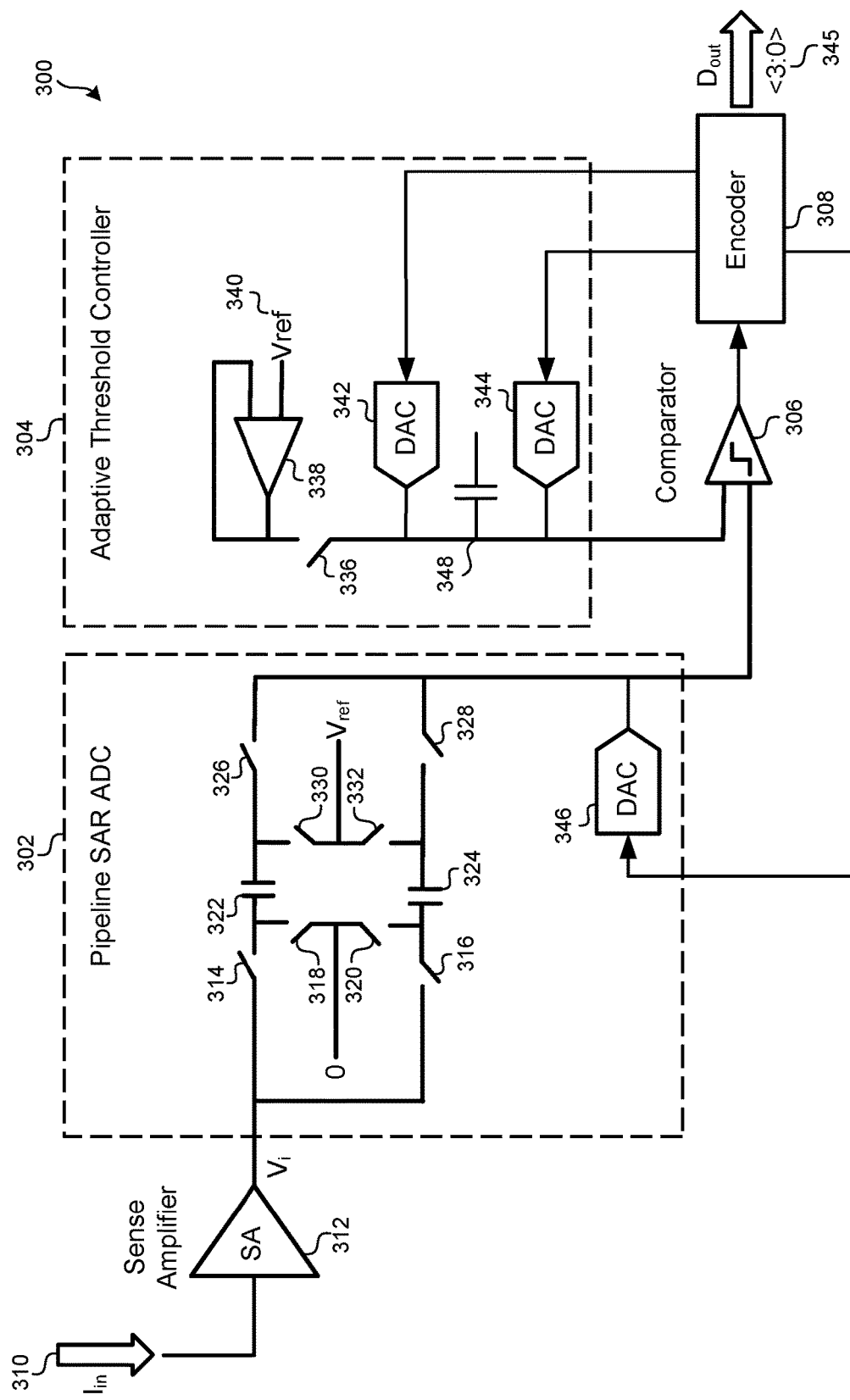
FIG. 3 illustrates an example of a multi-precision and self-calibrated ADC that generates binary partial output vectors, according to some embodiments.

FIG. 3 illustrates an example of a multi-precision and self-calibrated ADC 300 that generates binary partial output vectors, according to some embodiments. An input current 310 representing the analog output of the multiplier may be received at a sense amplifier 312. The sense amplifier may convert the analog current into a voltage that is fed into a pipelined capacitor network 302 for an ADC. The capacitor network 302 may include a plurality of capacitors and a plurality of switches such that a current result can be stored on a first capacitor while a previous result is read from a second capacitor by the ADC operation.

For example, when a first input is received from the multiplier, switch 314 and switch 330 may be closed such that a difference between the output voltage of the sense amplifier 312 and the $V_{ref}$ voltage reference may be stored on capacitor 322. Switch 326 and switch 318 may be open to isolate capacitor 322 from the rest of the capacitor network 302. Similarly, switch 316 and switch 332 may be open to isolate capacitor 322 from capacitor 324. Switch 328 and switch 320 may be closed such that a value on capacitor 324 may be provided to an input of a comparator 306 for an ADC operation. When a second input is received from the multiplier, the capacitor network 302 may open switch 314 and switch 330 while closing switch 316 and switch 332. This allows the second input to be stored on capacitor 324. During this second cycle, switch 326 and switch 318 may be closed such that the voltage capacitor 322 may be provided as an input to the comparator 306. These switching operations may be alternately repeated back and forth such that one of the capacitors 322, 324 receives the input from the sense amplifier 312, while the other one of the capacitors 322, 324 provides the input from a previous cycle to the comparator 306. This parallel pipeline of operations allows an ADC operation to be completed every clock cycle after the first clock cycle. In comparison, serial ADC operations without this pipelined approach use two clock cycles for every conversion operation: one clock cycle to store the input from the multiplier, and a second clock cycle to convert the stored input to a digital value. This pipelined embodiment effectively cuts the number of cycles required for an operation in half.

The ADC operation may be performed in part by a comparator 306. This comparator may receive a value provided by alternating stages of the pipeline from the capacitor network 302 at one input. At the other input, the comparator 306 may receive a voltage from an adaptive threshold controller 304. This adaptive threshold controller 304 may include a programmable voltage reference 340. This voltage reference 340 may be set dynamically during operation to a desired value. For example, a controller, a microcontroller, a computing system, a state machine, programmable logic, and/or a digital circuit may provide a digital output that is converted into an analog voltage using a DAC. Other embodiments may use adjustable resistors in a voltage divider to provide the voltage reference 340. Optionally, this example provides the voltage reference 340 to a unity gain buffer 338, which may be implemented by, for example, an op amp arranged as a voltage follower where the output is provided to the inverting input as negative feedback, and the voltage reference 340 is provided to the non-inverting input. A switch 336 may allow the voltage reference to be provided to the second input of the comparator 306.

This ADC operation may be carried out by performing successive comparisons by the comparator 306 for each value provided from the capacitor network 302. For example, an initial comparison may be made to generate a first bit in a partial output vector. The initial value of the voltage reference 340 may determine whether the input value from the capacitor network 302 represents a binary 0 or a binary 1. After this value is recorded as the MSB of the partial output vector, the encoder 308 may generate digital feedback signals that are routed into one or more DACs 342, 344, 346. These digital feedback values may be converted into analog voltages or analog feedback signals that are injected into one or both of the inputs to the comparator. For example, the feedback provided to DAC 346 may be dependent on the previous input received and the dynamic range for the ADC operation (i.e., the number of bits in each of the partial output vectors). The feedback provided to DAC 342 may be threshold dependent in the time domain, and may be adjusted with each successive bit that is generated in the partial output vector. The feedback provided to DAC 344 may be input dependent in the time domain, and may be adjusted based on a previous value generated in the partial output vector. Each output of the comparator 306 may be provided to a finite state machine in the encoder 308, and the finite state machine may generate feedback outputs for each of the DACs 342, 344, 346. Thus, during a single cycle, the comparator 306 may be repeatedly used to generate a partial output vector 345 of bits rather than a single bit output.

Each partial result from the multiplier provided as an analog input current 310 may generate a partial output vector 345 of any length. In other words, the dynamic range of the ADC operation may be set independently from the number of bits in the input vectors. For example, a 8-bit input vector may be provided to the multiplier, resulting in up to approximately 9 clock cycles to generate a full result. However, each of the partial output vectors 345 generated by the ADC operation may be set at 2 bits, 3 bits, 4 bits, and/or any other desired value. The number of bits in the partial output vectors 345 may be set dynamically for each individual MAC operation. For example, input vectors provided to the MAC may include inputs that set the number of bits to be processed by the one-bit DACs on the input, as well as the number of bits to be used in the partial output vectors 345 and the final output vector. This allows the overall process time for the MAC operation to be set as a trade-off with the precision of the MAC operation. This trade-off can be made for each operation individually without changing the hardware. Instead, the settings can be provided in software to the programmable ADC operation and/or to the multiplication operation.

Another benefit provided by these embodiments is the adjustable calibration and precision provided by the adaptive threshold controller 304. The voltage reference 340 can be adjusted to compensate for temperature variations, drift over time, process variations, and/or other factors that may cause an undesired differential between the inputs at the comparator 306. Some embodiments may also include capacitors, such as capacitor 348, that can be used to calibrate the values provided to the comparator. For example, test values may be provided to the MAC, and the resulting outputs may be compared to expected values for that operation. The difference between these expected values may be used to adjust the voltage reference 340. In some cases the state machine in the encoder 308 may also adjust the feedback values provided to the DACs 342, 344, 346.

Figure 4A:
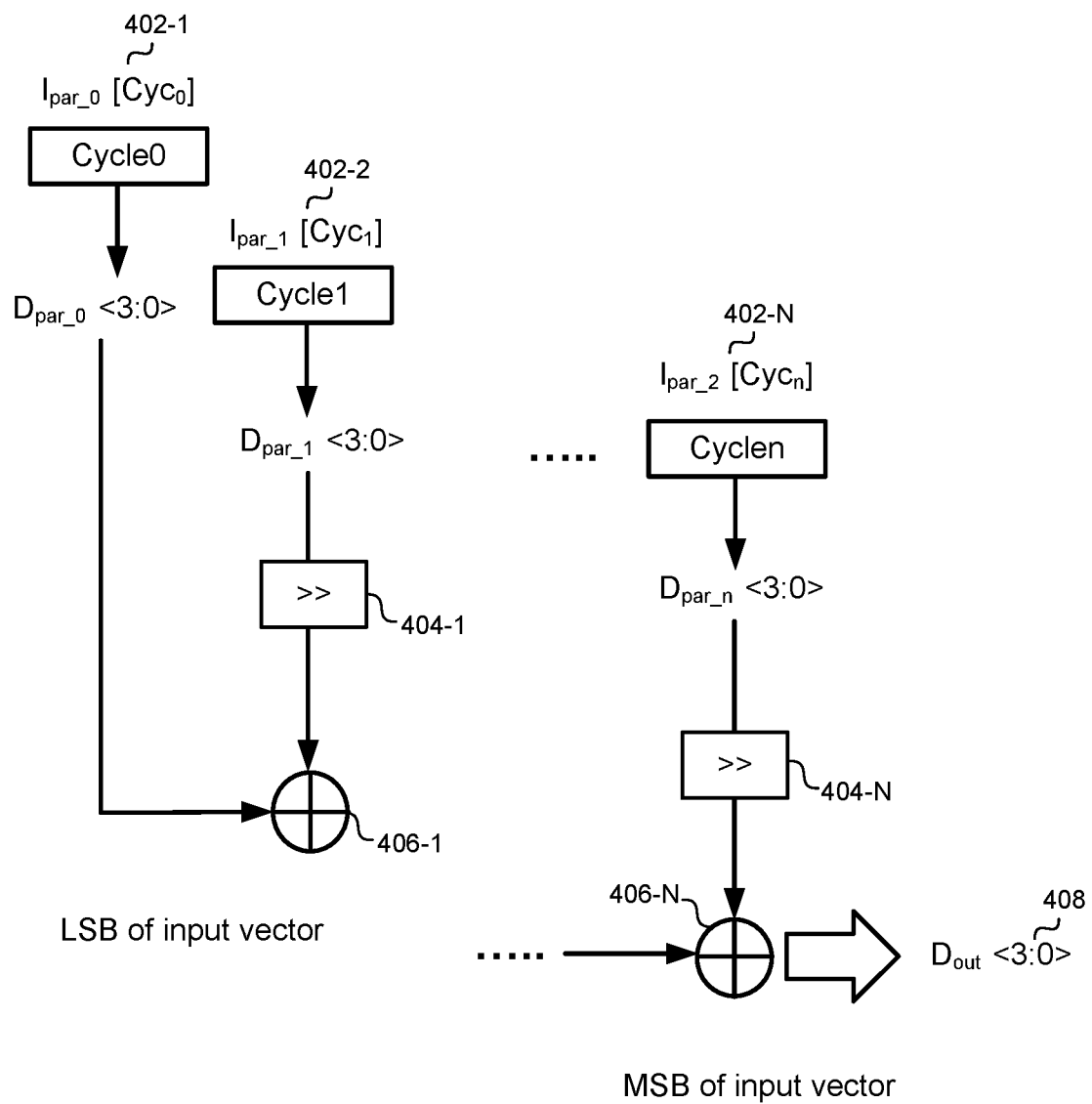
FIG. 4A illustrates a diagram of a binary-weighted summation circuit, according to some embodiments.

As described above, the partial output vectors generated by the ADC operation may be routed through switching fabric to a number of different locations. For example, the switching fabric may route the partial output vectors to a subsequent stage in a multi-MAC pipeline. Additionally or alternatively, the switching fabric may route the partial output vectors to a binary-weighted summation circuit. FIG. 4A illustrates a diagram of a binary-weighted summation circuit, according to some embodiments. Because the partial output vectors have already been converted to the binary domain by the ADC operation described above, these can be accumulated using binary shift operations 404 and/or binary addition operations 406. For example, a partial output vector 402-1 corresponding to an MSB may be received and stored in an accumulation register. Next, a partial output vector 402-2 corresponding to a next-MSB may be received, shifted according to its bit-order, and added to the previous value in the accumulation register. This procedure may continue until each of the bits provided at the input of the MAC have been processed for a MAC operation. Again, the number of bits in each of the partial output vectors may be set for each individual MAC operation, and may be limited only by the dynamic range of the ADC operation. After N+1 cycles, a final output 408 may be provided. In this example, 8-bit inputs have generated a 4-bit output.

Figure 4B:
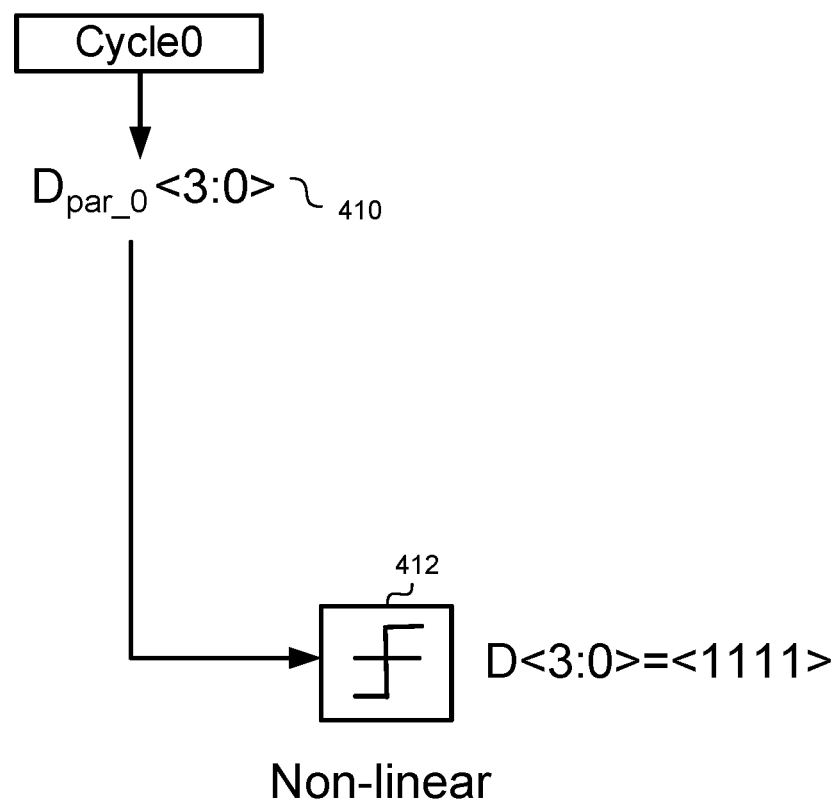
FIG. 4B illustrates a circuit for detecting when a MAC operation may be terminated early using a nonlinear threshold, according to some embodiments.

In some embodiments, the MAC operation may be terminated early based on the contents of the partial output vectors and/or the intermediate results of the binary-weighted summation operation. FIG. 4B illustrates a circuit for detecting when a MAC operation may be terminated early using a nonlinear threshold, according to some embodiments. For example, a nonlinear function 412 may determine when a maximum output value has been reached. If the partial output vector corresponding to the MSB of the input vectors is already at a maximum value (e.g., 1111), then the nonlinear function 412 may detect this occurrence. If the maximum value is already in the accumulation register, no additional accumulation needs to take place. In response, the MAC operation for the current inputs may be terminated early, and the partial output vector may be provided as the final output. This comparison may be made for individual partial output vectors and/or for the value in the accumulation register.

Figure 5:
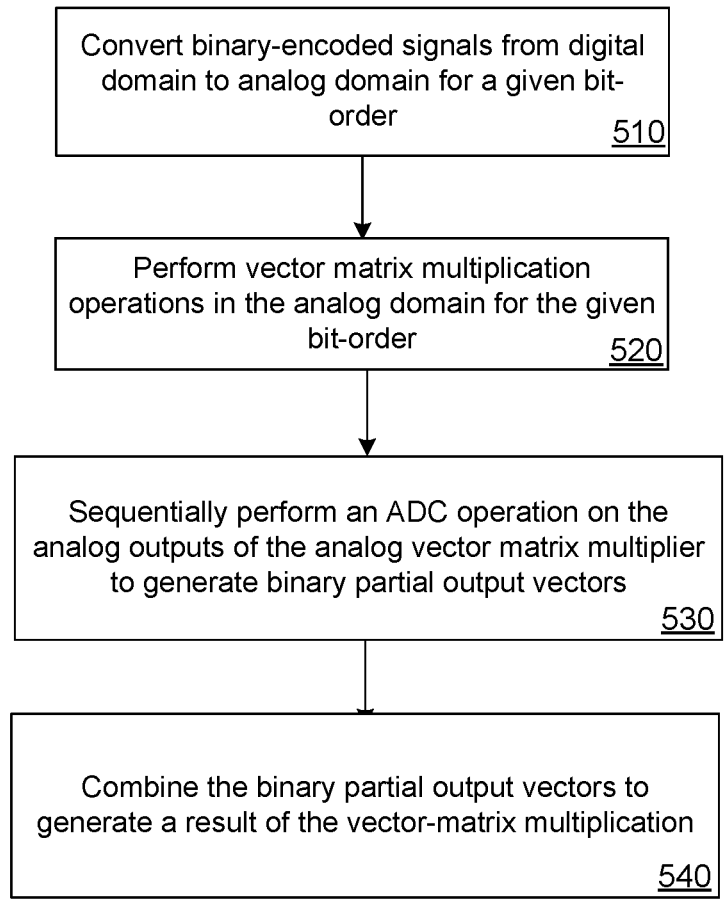
FIG. 5 illustrates a flowchart of a method for performing a vector-matrix multiplication operation, according to some embodiments.

FIG. 5 illustrates a flowchart 500 of a method for performing a vector-matrix multiplication operation, according to some embodiments. Flowchart 500 may be performed using the circuits of FIGS. 1-4 or with alternate versions of such circuits. That is, it should be understood that the specific examples of circuits, such as those in FIGS. 2-4, are examples of how the circuit of FIG. 1 and the method of FIG. 5 may be implemented.

The method may include converting a digital input vector comprising a plurality of binary-encoded values into a plurality of analog signals using a plurality of one-bit DACs (510). To perform this function, multiple one-bit DACs may be used in parallel. Therefore, each DAC may convert a digital signal to an analog signal for a given bit-order in parallel. Each DAC may receive a binary-encoded digital signal that is indicative of a particular bit-order for an input vector. Each vector may have N bits. Therefore, for the one-bit DACs to convert the binary-encoded digital signals to analog signals may take N clock cycles. For example, if the binary-encoded digital signal is "10011," it may take five clock cycles for this binary-encoded value (which represents a value of 19 assuming the right-most digit is the LSB) to be output by a one-bit DAC. The analog voltage output by each one-bit DAC may be dependent on a power voltage provided to each one-bit DAC.

The method may also include sequentially performing vector-matrix multiplication operations using a weighting matrix for the plurality of analog signals to generate analog outputs of an analog vector matrix multiplier (520). This operation may be performed for the particular bit-order of the input vectors received from the one-bit DACs. That is, this operation may first be performed for each LSB of the values of the input vector (then, during a next iteration of block 420, the second LSB may be evaluated). Typically, the first bit evaluated would be either the MSB or LSB of the values of the input vector. Vector matrix multiplication may be performed by a circuit similar to the circuit illustrated FIG. 2. It should be understood that other embodiments of analog multiplication circuits are possible. The vector matrix multiplication multiplier may include weighting components that each cause a weighted amount of current indicative of the product of the analog input value and the weighting. Such currents, or some other electrical characteristic, may be output to summation circuitry.

The method may additionally include sequentially performing an ADC operation on the analog outputs of the analog vector matrix multiplier to generate binary partial output vectors (530). In some embodiments, the ADC operation may include using a parallel pipeline of capacitors and switches as depicted in FIG. 3. The parallel pipeline may store a first voltage representing a first analog output on a first capacitor during a current clock cycle, and may read a second voltage representing a second analog output from a second capacitor received during a previous clock cycle. The ADC operation may include repeatedly generating comparisons using a comparator, where a finite state machine generates digital feedback for a plurality of DACs that inject the feedback into the comparator inputs between sequential comparisons. The sequential comparisons may generate the individual bits in the binary partial output vector as described above.

The method may further include combining the binary partial output vectors to generate a result of the vector-matrix multiplication (540). Because the binary partial output vectors are already in the binary domain, combining these vectors in a binary-weighted summation process may use binary shift and binary addition operations as described above in FIG. 4A-4B. In some embodiments, the binary partial output vectors may also be provided to a subsequent MAC circuit in a subsequent stage of a MAC pipeline.

Figure 6:
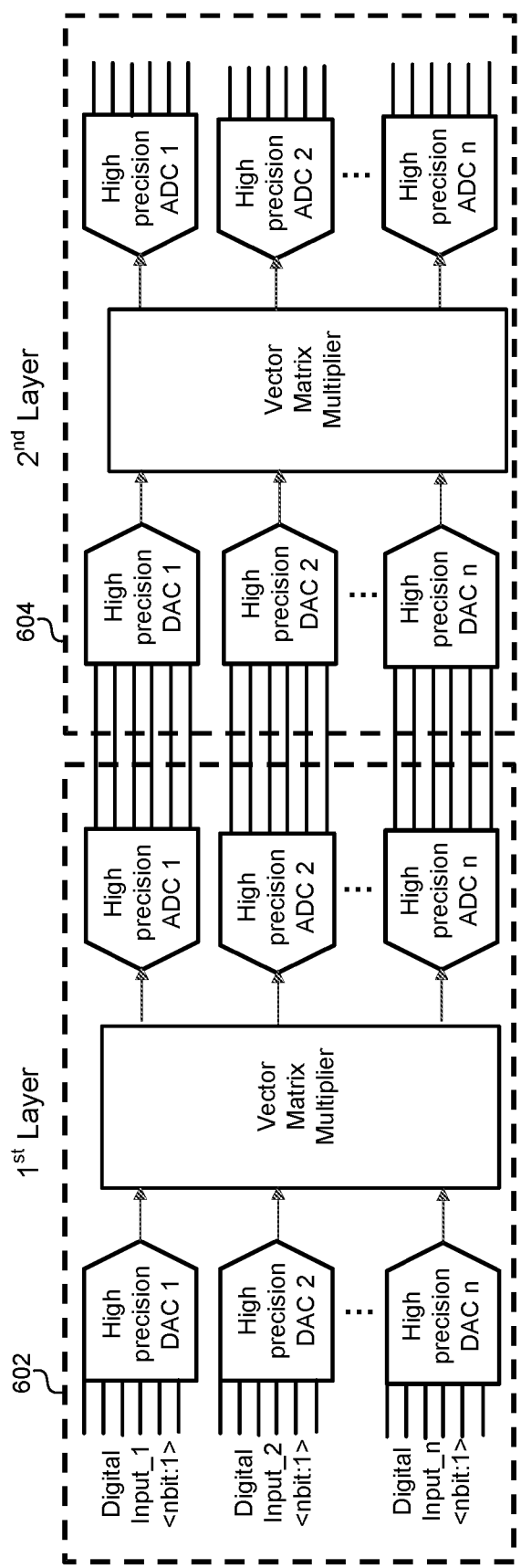
FIG. 6 illustrates a traditional pipeline of MAC operations, according to some embodiments.

FIG. 6 illustrates a traditional pipeline of MAC operations, according to some embodiments. Many modern computing applications may use pipelines comprising multiple layers of MAC operations. A first layer 602 in the pipeline may generate full results from MAC operations in the first stage. For example, a high precision DAC may receive a digital input, convert that digital input into an analog signal that can be processed through matrix multiplication operation. The analog output from the matrix multiplication operation can be fully converted using a high precision ADC into digital signals that may be output from the first layer 602. Note that the first layer 602, along with each subsequent layer, may include a plurality of inputs and generate a plurality of outputs. These inputs may all be processed in parallel in the first layer 602. Consequently, the resulting outputs may also be generated in parallel from the first layer 602.

In order for a second layer 604 to begin processing, the second layer 604 generally has to wait until all the outputs are generated by the first layer 602. Because the required precision and/or throughput of each layer is generally not known when the hardware is designed and manufactured, the second layer 604 and subsequent layers may also include high precision DACs that can accommodate the maximum number of bits in the pipeline. Additionally, second layer 604 and subsequent layers may also use high precision ADCs at the output. This leads to inefficient data conversion for mixed-signal vector matrix computing. Additionally, the connections between the first layer 602 and the second layer 604 are generally static and are not configurable. Because the area, cost, and power of the system grows rapidly with the precision of the DACs expanding multi-layer pipelines can become very expensive in terms of power and circuit area. Although using serial DACs at each level can improve the area and power efficiency, the data throughput rate is still reduced because the summation operation and the ADC operation from a previous stage needs to be completed before the resulting bits can be provided to a serial DAC of the subsequent stage.

Figure 7:
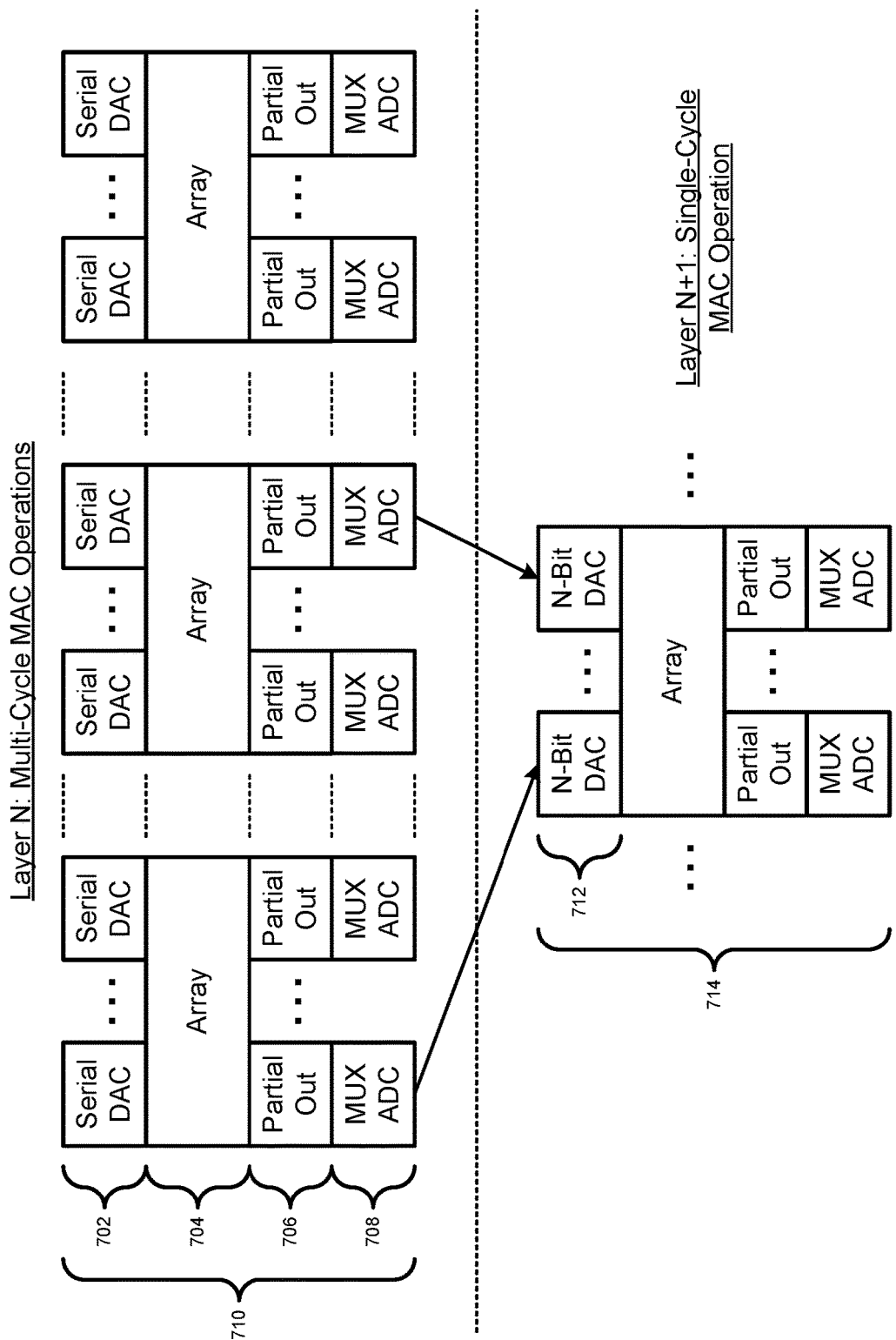
FIG. 7 illustrates a pipelined architecture for MAC operations that optimizes the throughput of each layer while providing programmable precision for each layer, according to some embodiments.

FIG. 7 illustrates multi-layer vector-matrix multiplier circuit that optimizes the throughput of each layer while providing programmable precision for each layer, according to some embodiments. A first layer of a crossbar MAC operation may include a plurality of MAC circuits. These MAC circuits may operate using bit-order operations as described above in FIGS. 1-4B. For example, the bit-order MACs 710 may include one-bit serial DACs 702 with multiplication arrays 704 that perform matrix multiplication operations as described above in FIG. 2A. Instead of generating analog outputs that are summed and then converted into a single binary output value, the bit-order MACs 710 may generate binary partial outputs 706. As described above, the ADCs that convert the analog partial outputs into binary partial outputs may include multiplexers 708 as part of the ADC operation. The multiplexers 708 may provide the binary partial outputs to a binary summation circuit that uses binary shift and binary addition operations to generate a final binary output. Additionally, the multiplexers 708 may be used to route the binary partial outputs to a subsequent stage in the MAC pipeline.

A second layer of MAC operations may include N-bit DACs 712 that are configured to receive the partial binary outputs generated by the first layer of MAC operations. As described above, the number of bits N in the binary partial outputs may be controlled dynamically at runtime. This allows the precision of the output to be controlled to any degree. This may be particularly useful in multi-layer MAC operations, as some intermediate results do not require high precision. Allowing the system to adjust the precision as needed, allows these operations to be done much more efficiently to increase the throughput of the system as a tradeoff. The DACs 712 at the second layer of MAC operations can be similarly configured at runtime to accept any number of bits for the binary partial outputs from the previous stage.

In addition to the adjustable precision and throughput provided by the system illustrated in FIG. 7, the multiplexers 708 add a degree of flexibility and programmability to the overall MAC pipeline. Instead of using static connections, the multiplexers 708 can route different binary partial outputs from the first layer to different DAC inputs in the second layer. Although these connections may generally stay static during a particular operation, they do allow the MAC pipeline to be reconfigured to support many different types of operations as needed. This allows a single hardware architecture to be compatible with many different applications. For example, artificial intelligence, neural networks, and deep-learning operations may benefit from allowing a designer to make the trade-off between throughput and precision at each stage of the MAC pipeline.

Figure 8A:
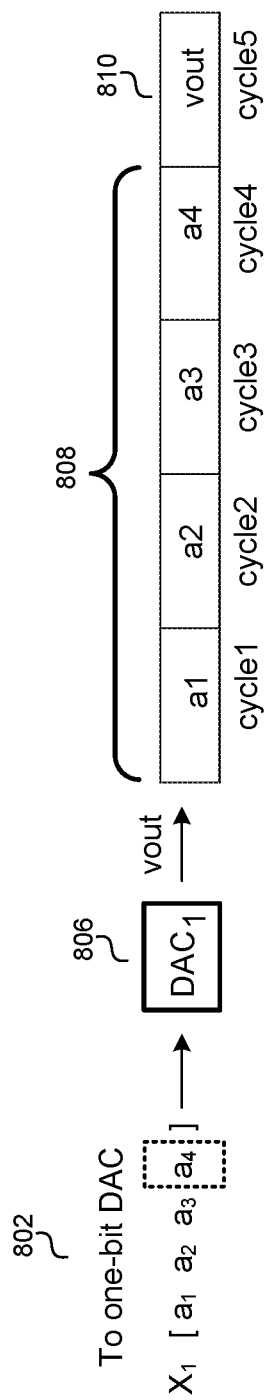
FIG. 8A illustrates a cycle timing diagram that generates binary partial results, according to some embodiments.

FIG. 8A illustrates a cycle timing diagram that generates binary partial results, according to some embodiments. As described in detail above, each bit in an N-bit input vector 802 may be provided to a one-bit DAC 806. Each of those bits may be processed through the analog multiplier to generate an M-bit binary partial output. The binary partial outputs 808 may be summed together in the binary domain at the end of the operation to generate a final output 810. For every clock cycle, the ADC of the MAC operation in the first layer may output one of the binary partial outputs 808.

Figure 8B:
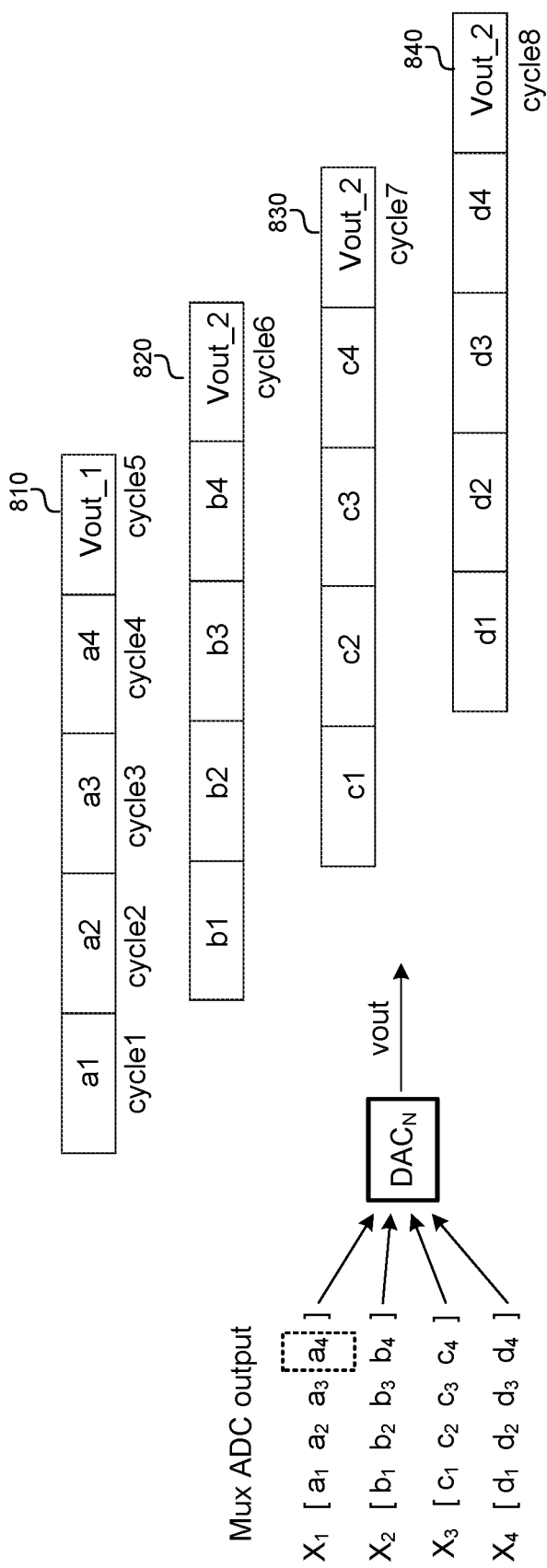
FIG. 8B illustrates a cycle timing diagram for processing incremental binary partial results in a subsequent MAC layer, according to some embodiments.

FIG. 8B illustrates a cycle timing diagram for processing incremental binary partial results in a subsequent MAC layer, according to some embodiments. As each partial output is generated from the first layer, the multi-bit DAC of the second layer may incrementally process the partial outputs from the first layer to perform a binary-weighted and DAC conversion based on the sequential inputs from the first layer's ADC. As described above, the result 810 of the first layer may be generated after N clock cycles. However, by processing the partial outputs sequentially at the second layer, the output 820 of the second layer may be generated on the next clock cycle N+1. Generally, the second layer may wait N+1 clock cycles to perform the conversion if the conversion time of the first layer is N clock cycles. With the pipelined operation of the multi-bit DAC, each subsequent layer may perform data conversions in each clock cycle after the initial delay. The throughput may be boosted in this manner for each layer in the MAC pipeline. After the second layer, the throughput may be as fast as the clock rate, and each subsequent layer has a maximum throughput to generate results 830, 840, etc., that is the same as the second layer.

It should be understood that these examples show only two layers in the MAC pipeline for the sake of clarity. Other embodiments may have many additional layers beyond the second layer that are not explicitly illustrated. Each of these layers may use a multi-bit DAC at the input and generate binary partial outputs for a subsequent layer as described above. Thus, the benefits of scalability in the throughput and precision of the DACs may be used in multi-layer applications, such as deep neural networks. For layers with large numbers of MAC units and a high precision requirement (such as in the first layer), the analog MAC may be configured with serial operations to save power and area. For subsequent layers that may benefit from high throughput, the analog MAC may be configured with a hybrid throughput operation to maximize the speed. The number of pipelined operations and the precision of the data converters may be flexibly configured as needed to optimize the performance and hardware cost depending on the requirements of, for example, a deep learning algorithm.

Figure 9:
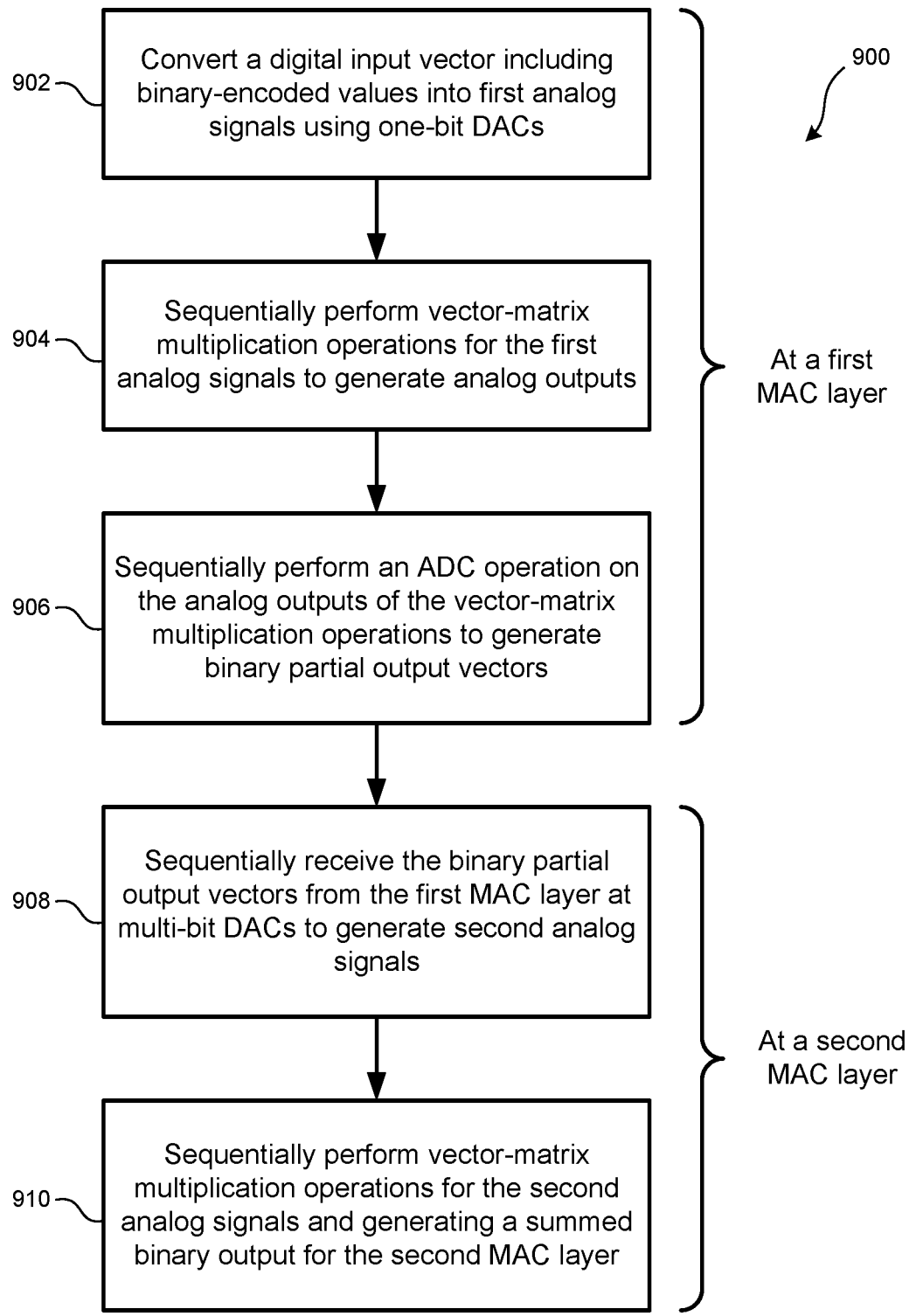
FIG. 9 illustrates a flowchart of a method for performing multi-stage MAC operations, according to some embodiments.

FIG. 9 illustrates a flowchart 900 of a method for performing multi-stage MAC operations, according to some embodiments. The method may include operations that take place at a first MAC layer, including converting a digital input vector comprising a plurality of binary-encoded values into a first plurality of analog signals using a plurality of one-bit DACs (902). The method may further include sequentially performing first vector-matrix multiplication operations for the first plurality of analog signals to generate analog outputs (904), and sequentially performing an ADC operation on the analog outputs of the first vector-matrix multiplication operations to generate binary partial output vectors (906). The first MAC layer may be implemented using any of the circuits described above in FIGS. 1-4. These portions of the method may also be executed as described above in FIG. 5. The first MAC layer may be arranged in comparison to a second MAC layer is depicted in FIG. 7.

Additionally, at a second MAC layer, the method may include sequentially receiving the binary partial output vectors from the first MAC layer at a plurality of multi-bit DACs to generate a second plurality of analog signals (908), and sequentially performing second vector-matrix multiplication operations for the second plurality of analog signals and generating a summed binary output for the second MAC layer (910). These operations may be carried out as described above in FIGS. 7-8B. For example, a plurality of multiplexers may be used to route the binary partial output vectors from the first MAC layer to the corresponding multi-bit DACs incrementally as the ADC operation in the first layer takes place. These multiplexers may also route the binary partial output vectors to a binary shift and binary add operation in the first MAC layer to generate a result for the first MAC layer. The summed binary output for the second MAC layer may be made available as soon as one clock cycle after the result for the first MAC layer is made available as described above in FIGS. 8A-8B.

The methods, systems, and devices discussed above are examples. Various configurations may omit, substitute, or add various procedures or components as appropriate. For instance, in alternative configurations, the methods may be performed in an order different from that described, and/or various stages may be added, omitted, and/or combined. Also, features described with respect to certain configurations may be combined in various other configurations. Different aspects and elements of the configurations may be combined in a similar manner. Also, technology evolves and, thus, many of the elements are examples and do not limit the scope of the disclosure or claims.

Specific details are given in the description to provide a thorough understanding of example configurations (including implementations). However, configurations may be practiced without these specific details. For example, well-known circuits, processes, algorithms, structures, and techniques have been shown without unnecessary detail in order to avoid obscuring the configurations. This description provides example configurations only, and does not limit the scope, applicability, or configurations of the claims. Rather, the preceding description of the configurations will provide those skilled in the art with an enabling description for implementing described techniques. Various changes may be made in the function and arrangement of elements without departing from the spirit or scope of the disclosure.

Also, configurations may be described as a process which is depicted as a flow diagram or block diagram. Although each may describe the operations as a sequential process, many of the operations can be performed in parallel or concurrently. In addition, the order of the operations may be rearranged. A process may have additional steps not included in the figure.

Having described several example configurations, various modifications, alternative constructions, and equivalents may be used without departing from the spirit of the disclosure. For example, the above elements may be components of a larger system, wherein other rules may take precedence over or otherwise modify the application of the invention. Also, a number of steps may be undertaken before, during, or after the above elements are considered.

What is claimed is:

1. A method for performing multi-layer vector-matrix multiplication operations, the method comprising:
at a first multiplier-accumulator (MAC) layer:
converting a digital input vector comprising a plurality of binary-encoded values into a first plurality of analog signals using a plurality of one-bit digital to analog converters (DACs);
sequentially performing first vector-matrix multiplication operations for the first plurality of analog signals to generate analog outputs; and
sequentially performing an analog-to-digital conversion (ADC) operation on the analog outputs of the first vector-matrix multiplication operations to generate binary partial output vectors for each bit-order; and
at a second MAC layer:
sequentially receiving the binary partial output vectors from the first MAC layer at a plurality of multi-bit DACs to generate a second plurality of analog signals; and
generating a summed binary output for the second MAC layer.

2. The method of claim 1, further comprising combining the binary partial output vectors to generate a result for the first MAC layer.

3. The method of claim 2, wherein the summed binary output for the second MAC layer is available one clock cycle after the result for the first MAC layer is available.

4. The method of claim 3, further comprising:
at a third MAC layer:
sequentially receiving second binary partial output vectors from the second MAC layer; and
generating a summed binary output for the third MAC layer that is available one clock cycle after the summed binary output for the second MAC layer.

5. The method of claim 1, further comprising routing the binary partial output vectors from the first MAC layer through one or more multiplexers after performing the ADC operation.

6. The method of claim 5, wherein the one or more multiplexers also route the binary partial output vectors to a binary shift and binary add operation in the first MAC layer.

7. The method of claim 1, wherein a number of bits received by the plurality of multi-bit DACs in the second MAC layer corresponds to a precision of the ADC operation in the first MAC layer.

8. The method of claim 1, wherein a number of clock cycles to sequentially perform the first vector-matrix multiplication operations is equal to a number of bit-orders of the binary-encoded values of the digital input vector.

9. The method of claim 1, wherein sequentially performing the ADC operation comprises:
storing a first voltage representing a first analog output in the analog outputs on a first capacitor during a current clock cycle; and
reading a second voltage representing a second analog output in the analog outputs on a second capacitor during the current clock cycle, wherein the second voltage was stored on the second capacitor during a previous clock cycle.

10. A multi-layer vector-matrix multiplier circuit comprising:
at a first multiplier-accumulator (MAC) layer:
a plurality of one-bit digital to analog converters (DACs), wherein each one-bit DAC outputs a binary-encoded analog signal for a corresponding digital input;
a first analog vector matrix multiplier circuit that performs binary-encoded vector multiplication operations on a single bit-order at a time, wherein the first analog vector matrix multiplier circuit receives the binary-encoded analog signal from each one-bit DAC of the plurality of one-bit DACs and generates analog outputs corresponding to the single bit-orders; and an analog-to-digital converter (ADC) that generates binary partial output vectors from the analog outputs;

at a second MAC layer:

a plurality of multi-bit DACs that sequentially receive the binary partial output vectors from the first MAC layer and generate a second plurality of analog signals; and a second analog vector matrix multiplier circuit that performs vector-matrix multiplication operations a single bit-order at a time for the second plurality of analog signals.

11. The multi-layer vector-matrix multiplier circuit of claim 10, further comprising a comparator that compares a voltage representing an analog output in the analog outputs to a voltage reference to generate the binary partial output vectors.

12. The multi-layer vector-matrix multiplier circuit of claim 11, further comprising a finite state machine that generates digital feedback based on a result of comparing the voltage to the voltage reference.

13. The multi-layer vector-matrix multiplier circuit of claim 12, further comprising a plurality of DACs that convert the digital feedback into analog feedback and inject the analog feedback into the voltage and the voltage reference to repeatedly generate bits through the comparator for a binary partial output vector in the binary partial output vectors.

14. The multi-layer vector-matrix multiplication circuit of claim 10, wherein the first analog vector matrix multiplier circuit outputs a plurality of currents indicative of vector multiplication outputs.

15. The multi-layer vector-matrix multiplication circuit of claim 10, wherein the first analog vector matrix multiplier circuit comprises a plurality of weighting components that apply a pre-defined weighting to output from the first analog vector matrix multiplier circuit.

16. The multi-layer vector-matrix multiplication circuit of claim 10, wherein the ADC comprises a capacitor network comprising a first pipeline and a second pipeline of capacitors and switches.

17. The multi-layer vector-matrix multiplication circuit of claim 10, further comprising, at the first MAC layer, a binary-weighted summation circuit comprising a binary shift and a binary addition operation.

18. The multi-layer vector-matrix multiplication circuit of claim 17, wherein the binary-weighted summation circuit comprises a circuit that detects when a maximum output value has been reached and terminates the binary-encoded vector multiplication operations.

19. The multi-layer vector-matrix multiplication circuit of claim 10, wherein a number of clock cycles to sequentially perform the binary-encoded vector multiplication operations for each bit-order is equal to a number of bit-orders of the corresponding digital input.

20. The multi-layer vector-matrix multiplication circuit of claim 10, wherein a summed binary output for the second MAC layer is available one clock cycle after a summed binary output for the first MAC layer is available.

* * * * *